(12) United States Patent
Busch et al.

(10) Patent No.: US 6,760,240 B2
(45) Date of Patent: Jul. 6, 2004

(54) CAM CELL WITH INTERDIGITATED SEARCH AND BIT LINES

(75) Inventors: Robert E. Busch, Essex Junction, VT (US); Albert M. Chu, Essex Junction, VT (US); Ezra D. B. Hall, Richmond, VT (US); Paul C. Parries, Wapingers Falls, NY (US); Daryl M. Seizter, Huntington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/065,822

(22) Filed: Nov. 22, 2002

(65) Prior Publication Data

US 2004/0100830 A1 May 27, 2004

(51) Int. Cl.[7] .............................................. G11C 15/00
(52) U.S. Cl. ...................... 365/49; 365/189.07; 365/63
(58) Field of Search ............................... 365/49, 189.07, 365/63

(56) References Cited

U.S. PATENT DOCUMENTS 6,320,777 B1 * 11/2001 Lines et al. .................... 365/49

* cited by examiner

Primary Examiner—Huan Hoang
(74) Attorney, Agent, or Firm—McGinn & Gibb, PLLC; Robert A. Walsh, Esq.

(57) ABSTRACT

A method and structure for an array of content addressable memory (CAM) cells is disclosed. Each of the CAM cells has a search line and a bitline parallel to the search line. Across the array, search lines and bit lines of the CAM cells are interdigitated so that the search lines and bitlines alternate across the array. CAM cell macro's are inverted with respect to adjacent macros to balance parasitic capacitances across the array.

19 Claims, 3 Drawing Sheets

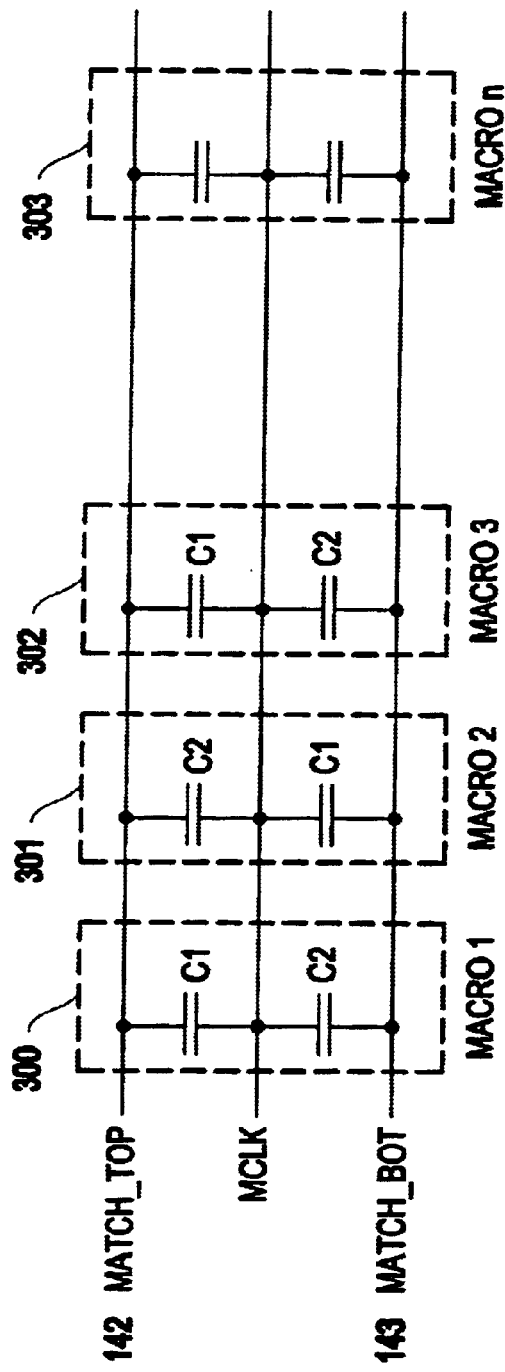
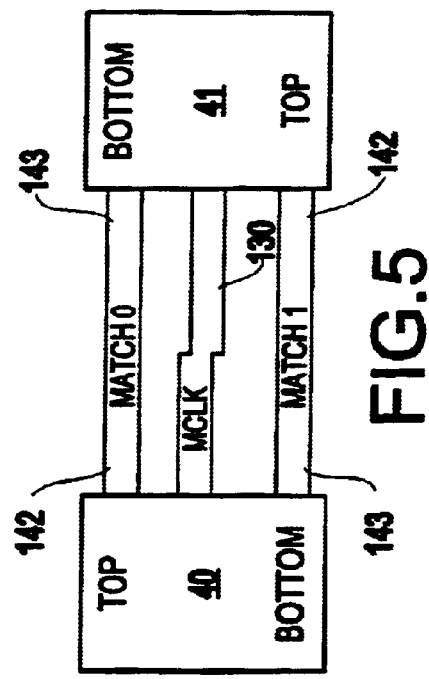
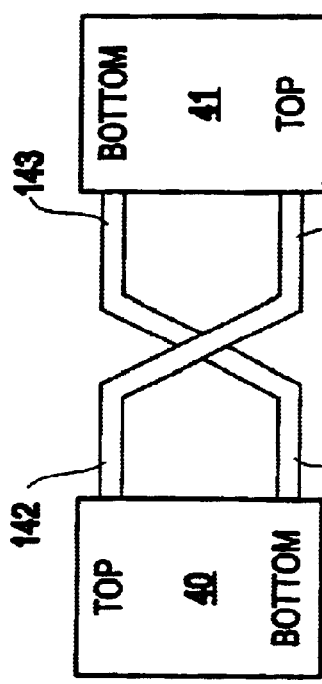
FIG. 3
FIG. 4
FIG. 5

CAM CELL WITH INTERDIGITATED SEARCH AND BIT LINES

BACKGROUND OF THE INVENTION

1. Field of the Invention

The present invention generally relates to an integrated circuit content addressable memory (CAM) cells in which the search line and the bit line are interdigitated.

2. Description of the Related Art

Content addressable memory (CAM) cells are very popular for use in integrated circuits because of their flexibility, cost effectiveness, and other efficiency reasons. However, CAM cells have some inefficiencies relating to capacitance and capacitive coupling. The invention described below overcomes these problems by providing new structures that reduce capacitive coupling without requiring shielding or other complicated schemes.

BRIEF SUMMARY OF THE INVENTION

The invention discloses an array of content addressable memory (CAM) cells. Each of the CAM cells has a search line and a bitline parallel to the search line. Across the array, search lines and bit lines of the CAM cells are interdigitated so that the search lines and bitlines alternate across the array.

In the invention, a top matchline and bottom matchline run perpendicular to the search line and the bitline. The array includes macros that have at least two of the CAM cells. Within each of the macros one of the following structures exists: a bit line is between two search lines; or a search line is between two bit lines. Each of the macros includes a common match clock line shared by the CAM cells within each macro. The layouts of adjacent macros are inverted with respect to one another. Each of the macros have a top wordline and a bottom wordline. The top wordline and the bottom wordline cross between each of the CAM macros. A match clock signal runs through each of the macros. The match clock signal includes a jog to accommodate the inverted layout of the adjacent macros.

The invention also discloses a memory array that has a plurality of content addressable memory (CAM) macros. Each of the macros includes at least two CAM cells. The layouts of the macros are alternatively inverted with respect to one another within the array so that layouts of each macro are inverted with respect to adjacent macros and to balance parasitic capacitance across the array.

The invention reduces cross-coupling noise between signals in a CAM design by interdigitating search and bit lines. Since bit lines and search lines are never active at the same time, the invention provides effective noise shielding during either a search or read/write operation. The inactive lines provide the necessary shielding between active lines. Further, the invention connects macros of CAM cells so as to balance parasitic capacitance between mirrored cells without impacting cell size by twisting match lines at separate metal levels or jogging the natty clock line connection between macros. By 'flip-flopping' macros, total parasitic capacitance mismatch between C1 and C2 of the overall design is balanced.

BRIEF DESCRIPTION OF THE DRAWINGS

The invention will be better understood from the following detailed description of preferred embodiments of the invention with reference to the drawings, in which:

FIG. 3 is a schematic diagram illustrating the capacitance between adjacent CAM cells;

FIG. 4 is a schematic diagram illustrating twisting of match lines between adjacent CAM cells; and FIG. 5 is a schematic diagram illustrating jogging of a match clock line between adjacent CAM cells

DETAILED DESCRIPTION OF PREFERRED EMBODIMENTS OF THE INVENTION

The invention reduces cross-coupling noise between signals in a CAM design by interdigitating search and bit lines. Since bit lines and search lines are never active at the same time, the invention provides effective noise shielding during either a search or read/write operation. The inactive lines provide the necessary shielding between active lines. Further, the invention presents a method/structure of connecting macros of CAM cells so as to balance parasitic capacitance between mirrored cells without impacting cell size by twisting match lines at separate metal levels or jogging the match clock line connection between macros. The invention does not increase the cell size and does not require shielding schemes at different metal levels.

Figure 1:
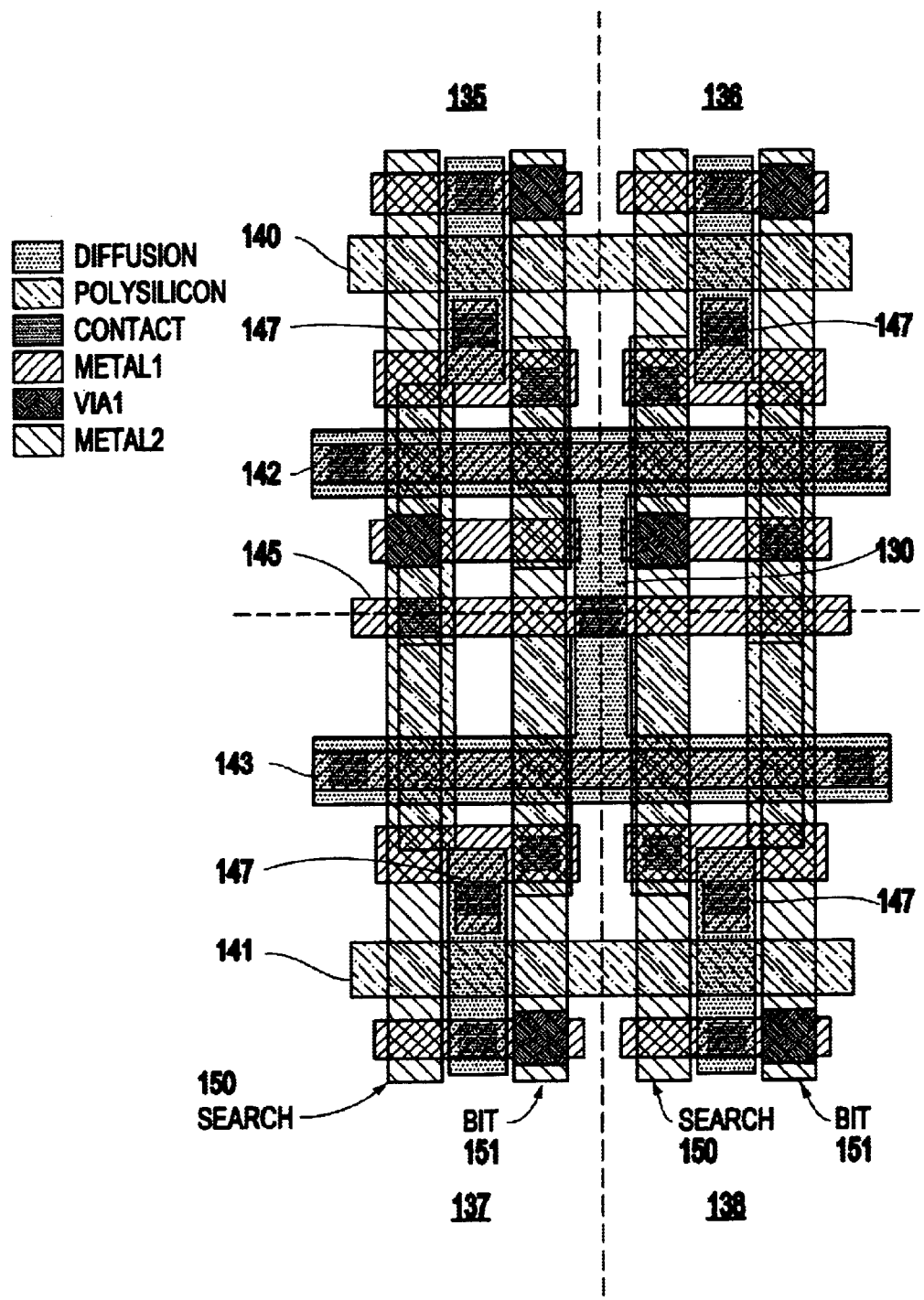
FIG. 1 is an example layout of interdigitated search and bitlines in a CAM cell.

FIG. 1 illustrates a CAM cell macro that includes four binary CAM cells 135, 136, 137, 138. Each of the cells includes a wordline 140, 141. Memory elements are illustrated as item 147. The upper match line is shown as item 142 and the lower match line is shown as item 143. The match lines 142, 143 are connected through transistors to the match clock line 145 via the contact 130. The match clock line 145 is central to the structure. As shown in FIG. 1, the search lines 150 are interdigitated with the bit lines 151. Therefore, each search line 150 has a bitline 151 between it and the next adjacent search line 150. Similarly each bitline 151 has a search line 150 between it and the next most adjacent bitline 151.

As explained above, since the bitlines 151 and search lines 150 are never active at the same time, the invention provides effective noise shielding during either a search or read/write operation. The inactive lines and extra distance provide the necessary shielding between active lines. The invention avoids the need for shielding or sharing of lines by providing a structure that (because the lines are interdigitated) naturally eliminates the parasitic capacitance problems.

Because of cell layout optimization techniques in current CAM design, there exists a parasitic capacitance mismatch between mirrored CAM cells in the same layout. In a typical layout, each macro contains two CAM cells, where one cell mirrors the other. This mirroring of cells allows for a layout optimized design but results in a parasitic capacitance mismatch between the adjacent CAM cells. This parasitic mismatch capacitance resides between the match lines of each cell and the shared match clock line. This mismatch capacitance is depicted schematically in FIG. 3 as C1, C2. To balance the parasitic capacitance mismatch, the invention designs each CAM macro layout as an inverted mirrored Image of the previous macro.

Figure 2:
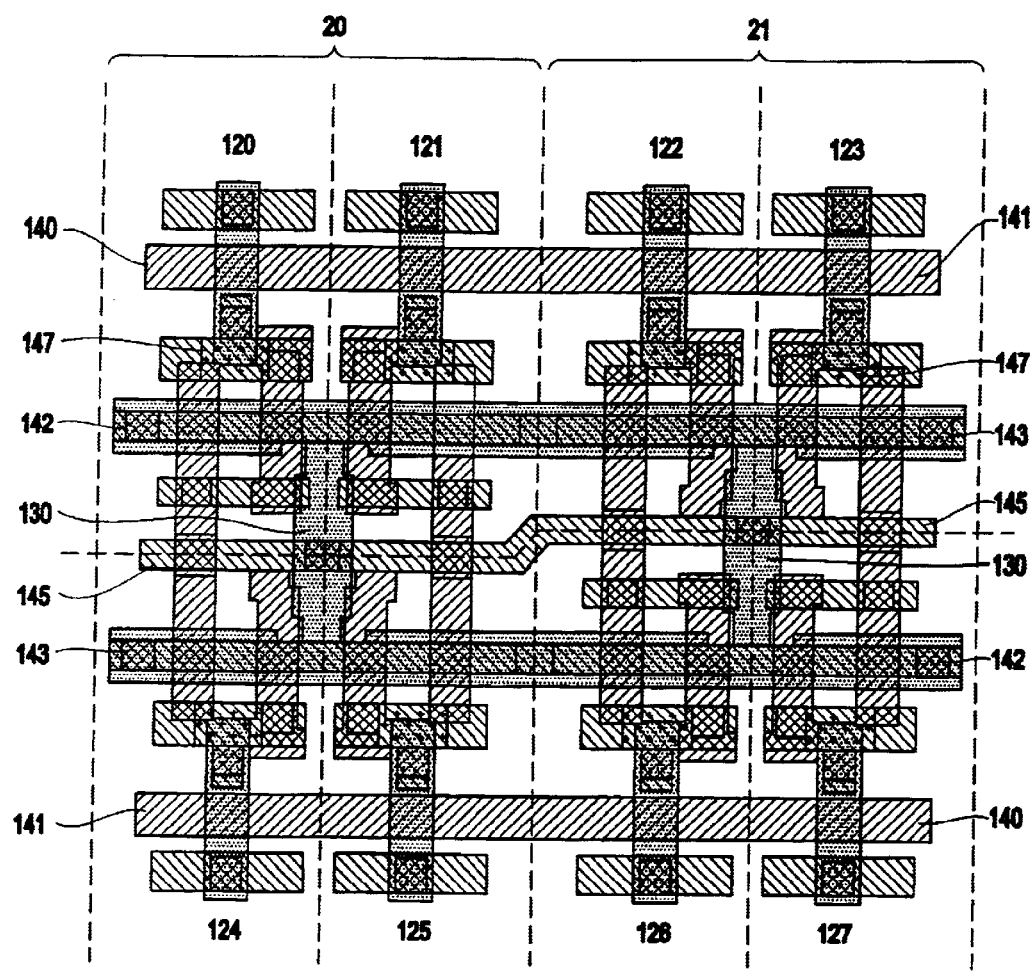
FIG. 2 is an example layout illustrating jogging of a match clock line between adjacent CAM cells.

More specifically, FIG. 2 illustrates two macros of four CAM cells each. The first macro 20 includes CAM cells 120, 121, 124, 125, while the second macro 21 includes CAM cells 122, 123, 126, 127. Alternatively, the macros could have the structure shown in FIG. 1. The layout of the two macros is inverted with respect to one another. For example, as shown in FIG. 2, macro 20 has the top wordline 140 at the top while macro 21 has the bottom wordline 141 at the top. Similarly the top and bottom match lines 142, 143 are opposite one another with respect to the two macros 20, 21. The match line clock line 145 includes a jog (e.g., a non-linear, angled portion) between the macros 20, 21 so as to accommodate this inverted layout. The structure is also shown in a more generalized format in FIG. 5.

As shown in FIG. 3, by inverting the layout of adjacent macros 300–303, the parasitic capacitance mismatch C1, C2 alternates along each of the macros in the series shown in FIG. 3. The inversion of adjacent CAM macro layouts 300–303, allows a balancing of the overall parasitic capacitance for an n-bit CAM entry. By 'flip-flopping' macros, total parasitic capacitance mismatch between C1 and C2 of the overall design is balanced. This invention provides two means for mirroring CAM macros, twisting and Jogging. The first technique involves jogging the match clock line (MCLK) connecting the macros, which is shown in FIGS. 2 and 5, as discussed above. The second technique involves crossing ("twisting") the match lines as shown FIG. 4. Notice that, as shown in FIGS. 2 and 5, the same wire MATCH0 comprises both the top match line 142 of macro 20 and the bottom match line 143 of macro 21. The complementary situation is true with wire MATCH1 shown at the bottom of FIGS. 2 and 5. To the contrary, when the match lines are twisted, as in the embodiment shown in FIG. 4, the same wire is used as the top match line 142 in both macros 40, 41. Similarly, the same wire is used for the bottom match line 143.

Thus, as shown above, the invention reduces cross-coupling noise between signals in a CAM design by inter-digitating search and bit lines. Since bit lines and search lines are never active at the same time, the invention provides effective noise shielding during either a search or read/write operation. The inactive lines provide the necessary shielding between active lines. Further, the invention connects macros of CAM cells so as to balance parasitic capacitance between mirrored cells without impacting cell size by twisting match lines at separate metal levels or jogging the match clock line connection between macros. By 'flip-flopping' macros, total parasitic capacitance mismatch between C1 and C2 of the overall design is balanced.

While the invention has been described in terms of preferred embodiments, those skilled in the art will recognize that the invention can be practiced with modification within the spirit and scope of the appended claims.

What is claimed is:

1. An array of content addressable memory (CAM) cells, each of said CAM cells comprising:
   a search line; and
   a bitline parallel to said search line,
   wherein across said array, search lines and bit lines of said CAM cells are interdigitated, such that said search lines and bit lines alternate across said array,
   wherein said array includes macros comprising at least two of said CAM cells, and
   wherein each of said macros includes a common match clock shared by the CAM cells within each macro.

2. The array of CAM cells in claim 1, further comprising a top matchline and bottom matchline running perpendicular to said search line and said bitline.

3. The array of CAM cells in claim 1, wherein within each of said macros one of the following structures exits:
   a bit is between two search lines; and
   a search line is between two bit lines.

4. An array of content addressable memory (CAM) cells, each of said CAM cells comprising:
   a search line; and
   a bitline parallel to said search line,
   wherein across said array, search lines and bits lines of said CAM cells are interdigitated, such that said search lines and bitlines alternate across said array,
   wherein said array includes macros comprising at least two of said CAM cells, and
   wherein layouts of adjacent macros are inverted with respect to one another.

5. The array of CAM cells in claim 4, further comprising a match clock signal running through each of said macros, wherein said match clock signal includes a jog to accommodate said inverted layout of said adjacent macros.

6. An array of content addressable memory (CAM) cells, each of said cells comprising:
   a search line; and
   a bitline parallel to said search line,
   wherein across said array, search lines and bit lines of said CAM cells are interdigitated, such that said search lines and bitlines alternate across said array,
   wherein said array includes macros comprising at least two of said CAM cells, and
   wherein each of said macros comprise:
      a top wordline; and
      a bottom wordline;
      wherein said top wordline and said bottom wordline cross between each of said CAM macros.

7. A memory array comprising:
   a plurality of content addressable memory (CAM) macros, wherein each of said macros includes at least two CAM cells,
   wherein layouts of said macros are alternatively inverted with respect to one another within said array, such that layouts of each macros are inverted with respect to adjacent macros.

8. The memory array in claim 7, wherein each of said macros comprises:
   a top wordline; and
   a bottom wordline,
   wherein, said top wordline and said bottom wordline cross between each of said macros.

9. The memory array in claim 7, further comprising a match clock signal running through each of said macros, wherein said match clock signal includes a jog to accommodate said inverted layout of said adjacent macros.

10. The memory array in claim 7, wherein each of said CAM cells comprises:
    a search line; and
    a bitline parallel to said search line,
    wherein across said array, search lines and bit lines of said CAM cells are interdigitated, such that said search lines and bitlines alternate across said array.

11. The array of CAM cells in claim 10, further comprising a top matchline and bottom matchline running perpendicular to said search line and said bitline.

12. The array of CAM cells in claim 10, wherein within each of said macros one of the following structure exists:
    a bit is between two search lines; and
    a search line is between two bit lines.

13. The array of CAM cells in claim 7, wherein each of said macros includes a common match clock line shared by the CAM cells within each macro.

14. A memory array comprising:

a plurality of content addressable memory (CAM) macros, wherein each of said macros includes at least two CAM cells, wherein layouts of said macros are alternatively inverted with respect to one another within said array, such that layouts of each macros are inverted with respect to adjacent macros and to balance parasitic capacitance across said array.

15. The memory array in claim 14, wherein each of said macros comprises:

a top wordline; and a bottom wordline, wherein, said top wordline and said bottom wordline cross between each of said macros.

16. The memory array in claim 14, further comprising a match clock signal running through each of said macros, wherein said match clock signal includes a jog to accommodate said inverted layout of said adjacent macros.

17. The memory array in claim 14, wherein each of said CAM cells comprises:

a search line; and a bitline parallel to said search line, wherein across said array, search lines and bit lines of said CAM cells are interdigitated, such that said search lines and bitlines alternated across said array.

18. The array of CAM cells in claim 17, further comprising a top matchline and bottom matchline running perpendicular to said search line and said bitline.

19. The array of CAM cells, in claim 17, wherein within each of said macros one of the following structure exists:

a bit line is between two search lines; and a search line is between two bit lines.

* * * * *

UNITED STATES PATENT AND TRADEMARK OFFICE
CERTIFICATE OF CORRECTION

PATENT NO. : 6,760,240 B2  
APPLICATION NO. : 10/065822  
DATED : July 6, 2004  
INVENTOR(S) : Robert E. Busch et al.

Page 1 of 1

It is certified that error appears in the above-identified patent and that said Letters Patent is hereby corrected as shown below:

Title Page, Item (75) Inventors:  
Delete, "Seizter", and Replace with, --Seitzer--.

Signed and Sealed this

Third Day of June, 2008

JON W. DUDAS  
*Director of the United States Patent and Trademark Office*